(12) United States Patent
Nandakumar

(10) Patent No.: US 9,853,034 B2
(45) Date of Patent: Dec. 26, 2017

(54) EMBEDDED MEMORY WITH ENHANCED CHANNEL STOP IMPLANTS

(71) Applicant: Texas Instruments Incorporated, Dallas, TX (US)

(72) Inventor: Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/091,546

(22) Filed: Apr. 5, 2016

(65) Prior Publication Data
US 2017/0287917 A1  Oct. 5, 2017

(51) Int. Cl.
| | |
|---|---|
| *H01L 27/11* | (2006.01) |
| *H01L 27/082* | (2006.01) |
| *H01L 27/092* | (2006.01) |
| *H01L 27/06* | (2006.01) |
| *H01L 29/06* | (2006.01) |
| *H01L 21/8249* | (2006.01) |
| *H01L 21/266* | (2006.01) |
| *H01L 21/265* | (2006.01) |

(52) U.S. Cl.
CPC ........ *H01L 27/1104* (2013.01); *H01L 21/266* (2013.01); *H01L 21/26513* (2013.01); *H01L 21/8249* (2013.01); *H01L 27/0623* (2013.01); *H01L 27/0826* (2013.01); *H01L 27/092* (2013.01); *H01L 27/1116* (2013.01); *H01L 29/0638* (2013.01)

(58) Field of Classification Search
CPC .......... H01L 21/823814; H01L 29/165; H01L 29/0847
See application file for complete search history.

(56) References Cited

U.S. PATENT DOCUMENTS

| | | | | |
|---|---|---|---|---|
| 5,610,421 A * | 3/1997 | Contiero | ............. | H01L 27/0623 257/316 |
| 5,674,762 A * | 10/1997 | See | ........................ | H01L 27/105 257/E21.689 |
| 6,432,791 B1 * | 8/2002 | Hutter | ................. | H01L 27/0629 257/E27.016 |
| 2002/0011612 A1 * | 1/2002 | Hieda | ............... | H01L 21/82381 257/262 |

(Continued)

*Primary Examiner* — Marcos D Pizarro
*Assistant Examiner* — Shannon Yi
(74) *Attorney, Agent, or Firm* — Kenneth Liu; Charles A. Brill; Frank D. Cimino

(57) ABSTRACT

An integrated circuit contains a logic MOS transistor and a memory MOS transistor of a same polarity. The logic MOS transistor has a logic channel stop layer. The memory MOS transistor has a memory channel stop layer. An average dopant density of the memory channel stop layer is higher than an average dopant density of the logic channel stop layer. The integrated circuit is formed by forming a global mask which exposes both the logic and memory MOS transistors. A global channel stop dose of dopants is implanted in the logic and memory MOS transistors. A memory mask is formed which exposes the memory MOS transistor and covers the logic MOS transistor. A memory channel stop dose of dopants of the same polarity is implanted into the memory MOS transistors. The memory channel stop dose of dopants are blocked from the logic MOS transistors.

13 Claims, 6 Drawing Sheets

(56) References Cited

U.S. PATENT DOCUMENTS

| | | | |
|---|---|---|---|
| 2002/0153591 A1* | 10/2002 | Nakazato | H01L 27/0214 257/544 |
| 2002/0179940 A1* | 12/2002 | Osada | G11C 11/412 257/204 |
| 2003/0164527 A1* | 9/2003 | Sugi | H01L 21/8234 257/401 |
| 2009/0026578 A1* | 1/2009 | Wu | H01L 29/7322 257/592 |
| 2014/0209994 A1* | 7/2014 | Roizin | H01L 29/792 257/324 |
| 2014/0353737 A1* | 12/2014 | Iwamoto | H01L 29/66825 257/315 |
| 2015/0048439 A1* | 2/2015 | Shum | H01L 29/7816 257/326 |
| 2016/0079344 A1* | 3/2016 | Agam | H01L 29/063 257/493 |
| 2016/0329094 A1* | 11/2016 | Luan | H01L 21/8249 |
| 2017/0148795 A1* | 5/2017 | Luan | H01L 27/1025 |

* cited by examiner

EMBEDDED MEMORY WITH ENHANCED CHANNEL STOP IMPLANTS

FIELD OF THE INVENTION

This invention relates to the field of integrated circuits. More particularly, this invention relates to metal oxide semiconductor (MOS) transistors in integrated circuits.

BACKGROUND OF THE INVENTION

Some integrated circuits contain logic circuits and memory cells having n-channel metal oxide semiconductor (NMOS) transistors and p-channel metal oxide semiconductor (PMOS) transistors. To reduce fabrication costs, the NMOS transistors in the memory cells and the logic circuits may be formed concurrently using the same ion implant steps and photolithographic steps, and similarly for the PMOS transistors in the memory cells and the logic circuits. Forming the transistor in the memory cells and logic circuit using the same implant doses undesirably reduces speed in the logic circuits due to channel stop implants under source and drain junctions of the transistors increasing junction capacitances. Further, leakage current in the memory cells is undesirably increased due to limited doses in the channel stop implants. Increasing or decreasing the channel stop dose adversely impacts the logic speed or memory cell leakage current, respectively. Using dedicated implant operations for separate channel stops in the logic and memory cells requires additional photolithographic steps and hence undesirably increases fabrication costs.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit contains a logic circuit having a logic MOS transistor, and a memory cell having a memory MOS transistor of a same polarity as the logic MOS transistor. The logic MOS transistor has a logic channel stop layer below a source and drain of the logic MOS transistor. A conductivity type of the logic channel stop layer is opposite from a conductivity type of the source and drain of the logic MOS transistor. The memory MOS transistor has a memory channel stop layer below a source and drain of memory MOS transistor. A conductivity type of the memory channel stop layer is the same conductivity type as the logic channel stop layer. An average dopant density of the memory channel stop layer is higher than an average dopant density of the logic channel stop layer.

The integrated circuit is formed by forming a global mask over the top surface of the integrated circuit which exposes both the logic and memory MOS transistors. A global channel stop dose of dopants of a same polarity as the logic and memory channel stop layers is implanted into the substrate in the logic and memory MOS transistors, while the global mask is in place. A memory mask is formed over the top surface which exposes the memory MOS transistor and covers the logic MOS transistor. A memory channel stop dose of dopants of the same polarity as the global channel stop dose of dopants is implanted into the memory MOS transistors while the memory mask is in place. The memory channel stop dose of dopants are blocked from the logic MOS transistors.

DETAILED DESCRIPTION OF EXAMPLE EMBODIMENTS

Figure 1:
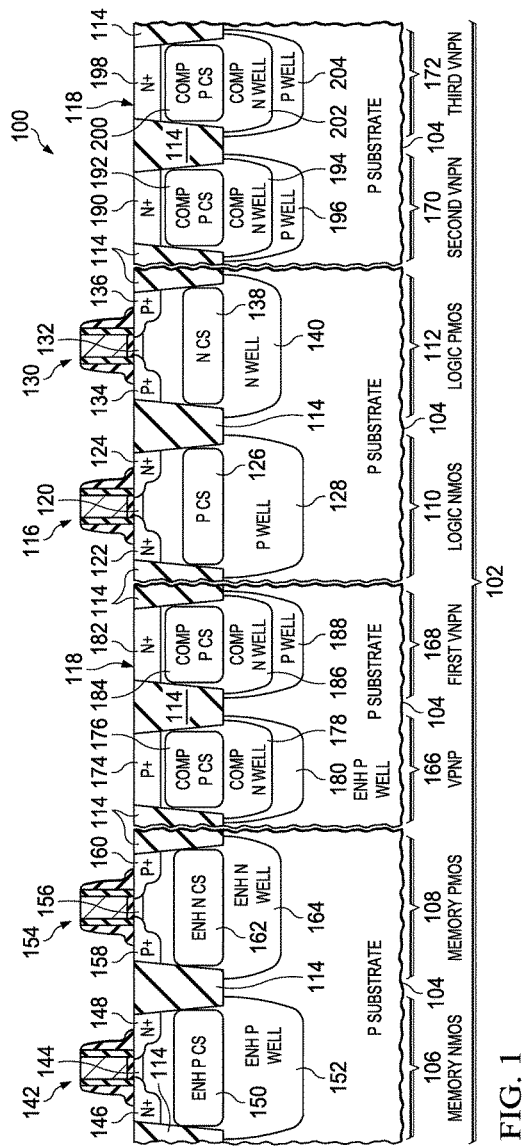
FIG. 1 is a cross section of an example integrated circuit containing logic transistors, memory transistors, and vertical bipolar transistors.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit contains logic circuits having a first logic MOS transistor, referred to herein as the first logic MOS, of a first polarity, and a memory cell having a first memory MOS transistor, referred to herein as the first memory MOS, also of the first polarity. The first logic MOS has a logic threshold layer in a substrate of the integrated circuit, below a gate structure of the first logic MOS, and a logic channel stop layer below a source and drain of the first logic MOS. A logic well is disposed in the substrate under the first logic MOS. The logic threshold layer, the logic channel stop layer and the logic well all have a first conductivity type which is opposite from a second conductivity type of the source and drain of the first logic MOS.

The first memory MOS has a memory threshold layer in the substrate below a gate structure of the first memory MOS, and a memory channel stop layer below a source and drain of the first memory MOS. A memory well is disposed in the substrate under the first memory MOS. The memory threshold layer, the memory channel stop layer and the memory well all have the first conductivity type; the source and drain of the first memory MOS have the second conductivity type. The integrated circuit may also optionally contain low power logic circuits having a first low power logic MOS transistor, referred to herein as the first low power MOS, which is formed concurrently with the first memory MOS.

An average dopant density of the memory threshold layer may be higher than an average dopant density of the logic threshold layer. An average dopant density of the memory channel stop layer may be 50 percent to 150 percent higher than an average dopant density of the logic channel stop layer. The higher average dopant density of the memory channel stop layer may advantageously reduce leakage current in the first memory MOS. The lower average dopant density of the logic channel stop layer may advantageously reduce drain capacitance in the first logic MOS. An average dopant density of the memory well may be higher than an average dopant density of the logic well. The higher average dopant density of the memory well may reduce debiasing of the memory well and enable sparser well taps, advantageously reducing a size of the integrated circuit.

The integrated circuit is formed by forming a global mask over the top surface of the integrated circuit which exposes both the first logic MOS and the first memory MOS, and the first low power MOS, if present. A global well dose of dopants may be implanted into the substrate in areas for the first logic MOS, the first memory MOS and the first low power MOS, while the global mask is in place. A global channel stop dose of dopants is implanted into the substrate in areas for the first logic MOS and the first memory MOS while the global mask is in place. A global threshold dose of dopants may be implanted into the substrate in areas for the first logic MOS, the first memory MOS and the first low power MOS, while the global mask is in place. The global well dose of dopants, the global channel stop dose of dopants and the global threshold dose of dopants are dopants of the first conductivity type. Additionally, a global threshold dose of dopants may be implanted while the global mask is in place.

An adder mask is formed over the top surface which exposes the first memory MOS and the first low power MOS, if present, and covers the first logic MOS. An adder well dose of dopants may be implanted into the substrate while the adder mask is in place. An adder channel stop dose of dopants is implanted into the substrate while the adder mask is in place. The adder channel stop dose of dopants may be 50 percent to 150 percent of the global channel stop dose of dopants. An adder threshold dose of dopants may be implanted into the substrate while the adder mask is in place. The adder well dose of dopants, the adder channel stop dose of dopants and the adder threshold dose of dopants are dopants of the first conductivity type. Implanting the adder well dose, the adder channel stop dose and the adder threshold dose using the same mask may advantageously reduce a fabrication cost of the integrated circuit.

The integrated circuit may include a second memory MOS, a second logic MOS, and optionally a second low power MOS, of a second, opposite polarity, which are formed in a similar manner: a global channel stop dose of dopants of the second conductivity type is implanted into the substrate in areas for the second memory MOS and the second logic MOS, and the second low power MOS, if present, and an adder channel stop dose of dopants of the second conductivity type is implanted into the substrate in the area for the second memory MOS and the second low power MOS if present. Similar advantages accrue to the integrated circuit as described for the first logic MOS and first memory MOS. A global well dose and a global threshold dose of dopants of the second conductivity type may be implanted concurrently with the global channel stop dose of dopants of the second conductivity type, and an adder well dose and an adder threshold dose may be implanted concurrently with the adder channel stop dose of dopants of the second conductivity type.

A vertical bipolar transistor may be formed in the integrated circuit by implanting at least one of the adder memory channel stop doses of dopants of one conductivity type and one of the channel stop doses of dopants of the opposite conductivity type into the substrate to form a compensated base in the vertical bipolar transistor. The vertical bipolar transistor has a different gain or breakdown voltage from a conventional vertical bipolar transistor in an integrated circuit with MOS transistors.

FIG. 1 is a cross section of an example integrated circuit containing logic transistors, memory transistors, and vertical bipolar transistors. The integrated circuit 100 has a substrate 102 comprising a semiconductor material 104 such as silicon. In the instant example, the semiconductor material 104 is p-type. The integrated circuit 100 includes a memory NMOS transistor 106, referred to herein as the memory NMOS 106, a memory PMOS transistor 108, referred to herein as the memory PMOS 108, a logic NMOS transistor 110, referred to herein as the logic NMOS 110, and a logic PMOS transistor 112, referred to herein as the logic PMOS 112. The memory NMOS 106 and the memory PMOS 108 may be, for example, part of a cell in a static random access memory (SRAM) array. The logic NMOS 110 and the logic PMOS 112 may be, for example, part of a logic gate or a buffer. Field oxide 114 may be disposed in the substrate 102 to laterally isolate components in the integrated circuit 100 as depicted in FIG. 1.

The logic NMOS 110 includes a gate structure 116 on a top surface 118 of the substrate 102. A p type logic threshold layer 120 may be disposed in the substrate 102 extending to the top surface 118 immediately below the gate structure 116. An average dopant density of the logic threshold layer 120 may be, for example, 1×1017 cm 3 to 5×1017 cm 3. An n type source 122 and n type drain 124 are disposed in the substrate 102 adjacent to the logic threshold layer 120 and extending partway under the gate structure 116. A p type logic channel stop layer 126, labeled "P CS," is disposed in the substrate 102 under the source 122, drain 124 and logic threshold layer 120. An average dopant density of p type dopants in the logic channel stop layer 126 may be, for example, 3×1017 cm 3 to 3×1018 cm 3. The p type dopants in the logic channel stop layer 126 are part of a global p type channel stop dopant layer; the global p type channel stop dopant layer is disposed in the logic NMOS 110 and the memory NMOS 106. The average dopant density of the global p type channel stop dopant layer in the logic channel stop layer 126 may be selected to provide a desired drain capacitance of the logic NMOS 110, and so provide a desired speed in a logic circuit containing the logic NMOS 110. Furthermore, a depth, that is a vertical distance below the top surface 118, of a peak density of the global p type channel stop dopant layer may also be selected to provide the desired drain capacitance and desired speed in the logic circuit. The logic threshold layer 120, the source 122, the drain 124 and the logic channel stop layer 126 may be disposed in a p type well 128, labeled "P WELL," which extends below the field oxide 114. An average dopant density of a portion of the p type well 128 below the field oxide 114 may be, for example, 3×1017 cm 3 to 3×1018 cm 3.

The logic PMOS 112 includes a gate structure 130 on the top surface 118 of the substrate 102. An n-type logic threshold layer 132 may be disposed in the substrate 102 extending to the top surface 118 immediately below the gate structure 130. An average dopant density of the logic threshold layer 132 may be, for example, $8 \times 10^{16}$ cm$^{-3}$ to $4 \times 10^{17}$ cm$^{-3}$. A p-type source 134 and p-type drain 136 are disposed in the substrate 102 adjacent to the logic threshold layer 132 and extending partway under the gate structure 130. An n-type logic channel stop layer 138, labeled "N CS," is disposed in the substrate 102 under the source 134, drain 136 and logic threshold layer 132. An average dopant density of n-type dopants in the logic channel stop layer 138 may be, for example, $2 \times 10^{17}$ cm$^{-3}$ to $2 \times 10^{18}$ cm$^{-3}$. The n-type dopants in the logic channel stop layer 138 are part of a global n-type channel stop dopant layer; the global n-type channel stop dopant layer is disposed in the logic PMOS 112 and the memory PMOS 108. The average dopant density and a peak density depth of the global n-type channel stop dopant layer may be selected to provide a desired drain capacitance of the logic PMOS 112, accruing the speed advantage described with respect to the logic NMOS 110. The logic threshold layer 132, the source 134, the drain 136 and the logic channel stop layer 138 may be disposed in an n-type well 140, labeled "N WELL," which extends below the field oxide 114. An average dopant density of a portion of the p-type well 128 below the field oxide 114 may be, for example, $7 \times 10^{17}$ cm$^{-3}$ to $7 \times 10^{18}$ cm$^3$.

The memory NMOS 106 includes a gate structure 142 on the top surface 118 of the substrate 102. A p-type memory threshold layer 144 may be disposed in the substrate 102 extending to the top surface 118 immediately below the gate structure 142. An average dopant density of the memory threshold layer 144 may be higher, for example, 25 percent to 75 percent higher, than the average dopant density of the logic threshold layer 120 of the logic NMOS 110. The higher average dopant density of the memory threshold layer 144 provides a higher threshold voltage of the memory NMOS 106 which may advantageously improve a static noise margin of an SRAM cell containing the memory NMOS 106. An n-type source 146 and n-type drain 148 are disposed in the substrate 102 adjacent to the memory threshold layer 144 and extending partway under the gate structure 142. A p-type memory channel stop layer 150, labeled "ENH P CS," is disposed in the substrate 102 under the source 146, drain 148 and memory threshold layer 144. An average dopant density of p-type dopants in the memory channel stop layer 150 is 50 percent to 150 percent higher than the average dopant density of the logic channel stop layer 126 of the logic NMOS 110. A first portion of the p-type dopants in the memory channel stop layer 150 are part of the global p-type channel stop dopant layer. A second portion of the p-type dopants in the memory channel stop layer 150 are part of an adder p-type channel stop dopant layer; the adder p-type channel stop dopant layer is disposed in the memory NMOS 106 but is not disposed in the logic NMOS 110. The global p-type channel stop dopant layer and the adder p-type channel stop dopant layer provide substantially all of the p-type dopants in the memory channel stop layer 150. The adder p-type channel stop dopant layer may be shallower than the global p-type channel stop dopant layer, so that a peak density of the memory channel stop layer 150 may be 50 nanometers to 150 nanometers shallower than a peak density of the logic channel stop layer 126. The higher average dopant density of the memory channel stop layer 150 may advantageously reduce leakage current in the memory NMOS 106. The shallower peak density of the memory channel stop layer 150 may further reduce leakage current in the memory NMOS 106. The memory threshold layer 144, the source 146, the drain 148 and the memory channel stop layer 150 may be disposed in a p-type enhanced well 152, labeled "ENH P WELL," which extends below the field oxide 114. An average dopant density of a portion of the p-type enhanced well 152 below the field oxide 114 may be, for example, 25 percent to 150 percent higher, than the average dopant density of the portion of the p-type well 128 of the logic NMOS 110. The higher average dopant density of the portion of the p-type enhanced well 152 may reduce debiasing of the p-type enhanced well 152 and thus enable more memory cells between well taps in the memory array, sometimes referred to as strap cells, advantageously reducing a size of the memory array and thereby reducing fabrication cost of the integrated circuit 100.

The memory PMOS 108 includes a gate structure 154 on the top surface 118 of the substrate 102. An n-type memory threshold layer 156 may be disposed in the substrate 102 extending to the top surface 118 immediately below the gate structure 154. An average dopant density of the memory threshold layer 156 is higher, for example, 25 percent to 75 percent higher, than the average dopant density of the logic threshold layer 132 of the logic PMOS 112. The higher average dopant density of the memory threshold layer 156 provides a higher threshold voltage of the memory PMOS 108 which may advantageously improve a static noise margin of an SRAM cell containing the memory PMOS 108. A p-type source 158 and p-type drain 160 are disposed in the substrate 102 adjacent to the memory threshold layer 156 and extending partway under the gate structure 154. An n-type memory channel stop layer 162, labeled "ENH N CS," is disposed in the substrate 102 under the source 158, drain 160 and memory threshold layer 156. An average dopant density of n-type dopants in the memory channel stop layer 162 is 50 percent to 150 percent higher than the average dopant density of the logic channel stop layer 138 of the logic PMOS 112. A first portion of the n-type dopants in the memory channel stop layer 162 are part of the global n-type channel stop dopant layer. A second portion of the n-type dopants in the memory channel stop layer 162 are part of an adder n-type channel stop dopant layer; the adder n-type channel stop dopant layer is disposed in the memory PMOS 108 but is not disposed in the logic NMOS 112. The global n-type channel stop dopant layer and the adder n-type channel stop dopant layer provide substantially all of the n-type dopants in the memory channel stop layer 162. The adder n-type channel stop dopant layer may be shallower than the global n-type channel stop dopant layer, so that a peak density of the memory channel stop layer 162 may be 50 nanometers to 150 nanometers shallower than a peak density of the logic channel stop layer 138. The higher average dopant density of the memory channel stop layer 162 may advantageously reduce leakage current in the memory PMOS 108. The shallower peak density of the adder n-type channel stop dopant layer may further reduce leakage current in the memory PMOS 108. The memory threshold layer 156, the source 158, the drain 160 and the memory channel stop layer 162 may be disposed in an n-type enhanced well 164, labeled "ENH N WELL," which extends below the field oxide 114. An average dopant density of a portion of the n-type enhanced well 164 below the field oxide 114 may be, for example, 25 percent to 150 percent higher than the average dopant density of the portion of the n-type well 140 of the logic PMOS 112. The higher average dopant density of the portion of the n-type enhanced well 164 may reduce debiasing of the n-type enhanced well 164 and thus advantageously enable a reduced size of the memory array as described in reference to the memory NMOS 106.

The integrated circuit 100 may optionally include one or more vertical bipolar transistors with compensated channel stop regions. The instant example will describe four such vertical bipolar transistors: a vertical PNP bipolar transistor 166 referred to herein as the VPNP 166, a first vertical NPN bipolar transistor 168 referred to herein as the first VNPN 168, a second vertical NPN bipolar transistor 170 referred to herein as the second VNPN 170, and a third vertical NPN bipolar transistor 172 referred to herein as the third VNPN 172. Other such vertical bipolar transistors are within the scope of the instant example.

The VPNP 166 has a p-type emitter which includes a heavily doped p-type layer 174 disposed in the substrate 102. The heavily doped p-type layer 174 may have a similar dopant density to the source 158 and drain 160 of the memory PMOS 108, as a result of being formed concurrently. The emitter also includes a compensated p-type channel stop region 176, labeled "COMP. P CS," disposed in the substrate 102 below the heavily doped p-type layer 174. The compensated p-type channel stop region 176 includes the adder n-type channel stop dopant layer, the global p-type channel stop dopant layer and the adder p-type channel stop dopant layer, but does not include the global n-type channel stop dopant layer. The VPNP 166 has a base which includes a compensated n-type well 178, labeled "COMP N WELL," disposed in the substrate 102 below the compensated p-type channel stop region 176. The VPNP 166 has a p-type collector which includes a p-type enhanced well 180, labeled "ENH P WELL," disposed in the substrate 102 below the compensated n-type well 178. The p-type enhanced well 180 has a distribution of p-type dopants that is substantially equal to a distribution of p-type dopants in the p-type enhanced well 152 under the memory NMOS 106. The compensated n-type well 178 has a distribution of n-type dopants that is partially compensated by p-type dopants of the p-type enhanced well 180. The VPNP 166 may have a gain of 0.7 to 20 and a base-collector breakdown voltage greater than 10 volts, for the dopant densities disclosed in the instant example. The VPNP 166 may be used in circuits requiring a rectification function with a breakdown voltage greater than an operating voltage of the logic circuits, referred to herein as Vdd.

The first VNPN 168 has an n-type emitter which includes a heavily doped n-type layer 182 disposed in the substrate 102. The heavily doped n-type layer 182 may have a similar dopant density to the source 146 and drain 148 of the memory NMOS 106, as a result of being formed concurrently. The first VNPN 168 has a base which includes a compensated p-type channel stop region 184, labeled "COMP. P CS," disposed in the substrate 102 below the heavily doped n-type layer 182. The compensated p-type channel stop region 184 includes the adder p-type channel stop dopant layer, the global n-type channel stop dopant layer and the adder n-type channel stop dopant layer, but does not include the global p-type channel stop dopant layer. The first VNPN 168 has a collector which includes a compensated n-type well 186, labeled "COMP N WELL," disposed in the substrate 102 below the compensated p-type channel stop region 184. A p-type well 188, labeled "P WELL," is disposed in the substrate 102 below the compensated n-type well 186. The compensated n-type well 186 has a distribution of n-type dopants that is partially compensated by p-type dopants of the p-type well 188. The first VNPN 168 may have a gain of 0.7 to 20 and a base-collector breakdown voltage greater than 10 volts, for the dopant densities disclosed in the instant example. The first VNPN 168 may be used in circuits requiring a rectification function of opposite polarity from the rectification function provided by the VPNP 166, with a breakdown voltage greater than 10 volts.

The second VNPN 170 has an n-type emitter which includes a heavily doped n-type layer 190 disposed in the substrate 102. The heavily doped n-type layer 190 may have a similar dopant density to the source 146 and drain 148 of the memory NMOS 106. The second VNPN 170 has a base which includes a compensated p-type channel stop region 192, labeled "COMP. P CS," disposed in the substrate 102 below the heavily doped n-type layer 190. The compensated p-type channel stop region 192 includes the adder p-type channel stop dopant layer and the global n-type channel stop dopant layer, but does not include the adder n-type channel stop dopant layer or the global p-type channel stop dopant layer. The second VNPN 170 has a collector which includes a compensated n-type well 194 labeled "COMP N WELL," disposed in the substrate 102 below the compensated p-type channel stop region 192. A p-type well 196, labeled "P WELL," is disposed in the substrate 102 below the compensated n-type well 194. The compensated n-type well 194 has a distribution of n-type dopants that is partially compensated by p-type dopants of the p-type well 196. The second VNPN 170 may have a gain of 1.2 to 20 and a base-collector breakdown voltage greater than 10 volts, for the dopant densities disclosed in the instant example. The second VNPN 170 may be used in circuits requiring a rectification function with a low depletion current component, for example in a bandgap circuit or a thermal diode circuit.

The third VNPN 172 has an n-type emitter which includes a heavily doped n-type layer 198 disposed in the substrate 102. The heavily doped n-type layer 198 may have a similar dopant density to the source 146 and drain 148 of the memory NMOS 106. The third VNPN 172 has a base which includes a compensated p-type channel stop region 200, labeled "COMP P CS," disposed in the substrate 102 below the heavily doped n-type layer 198. The compensated p-type channel stop region 200 includes the adder p-type channel stop dopant layer and the adder n-type channel stop dopant layer, but does not include the global n-type channel stop dopant layer or the global p-type channel stop dopant layer. The third VNPN 172 has a collector which includes a compensated n-type well 202, labeled "COMP N WELL," disposed in the substrate 102 below the compensated p-type channel stop region 200. A p-type well 204, labeled "P WELL," is disposed in the substrate 102 below the compensated n-type well 202. The compensated n-type well 202 has a distribution of n-type dopants that is partially compensated by p-type dopants of the p-type well 204. The third VNPN 172 may have a gain of 1.2 to 20, and may be different from the gain of the second VNPN 170, for the dopant densities disclosed in the instant example. The third VNPN 172 may be used in circuits requiring a rectification function with a low depletion current component.

In the instant example, the VPNP 166, the first VNPN 168, the second VNPN 170 and the third VNPN 172 do not require fabrication steps beyond those required for formation of the memory NMOS 106, the memory PMOS 108, the logic NMOS 110 and the logic PMOS 112, advantageously providing low fabrication cost and complexity of the integrated circuit 100. The integrated circuit 100 may include any subset of the VPNP 166, the first VNPN 168, the second VNPN 170 and the third VNPN 172. Electrical connections to the bases of the VPNP 166, the first VNPN 168, the second VNPN 170 and the third VNPN 172 may be made to lateral extensions of the bases out of the plane of FIG. 1. Similarly, electrical connections to the collectors of the VPNP 166, the first VNPN 168, the second VNPN 170 and the third VNPN 172 may be made to lateral extensions of the bases out of the plane of FIG. 1. The integrated circuit 100 may include other vertical bipolar transistors with compensated channel stop regions, similar to those disclosed in the instant example.

Figure 2A:
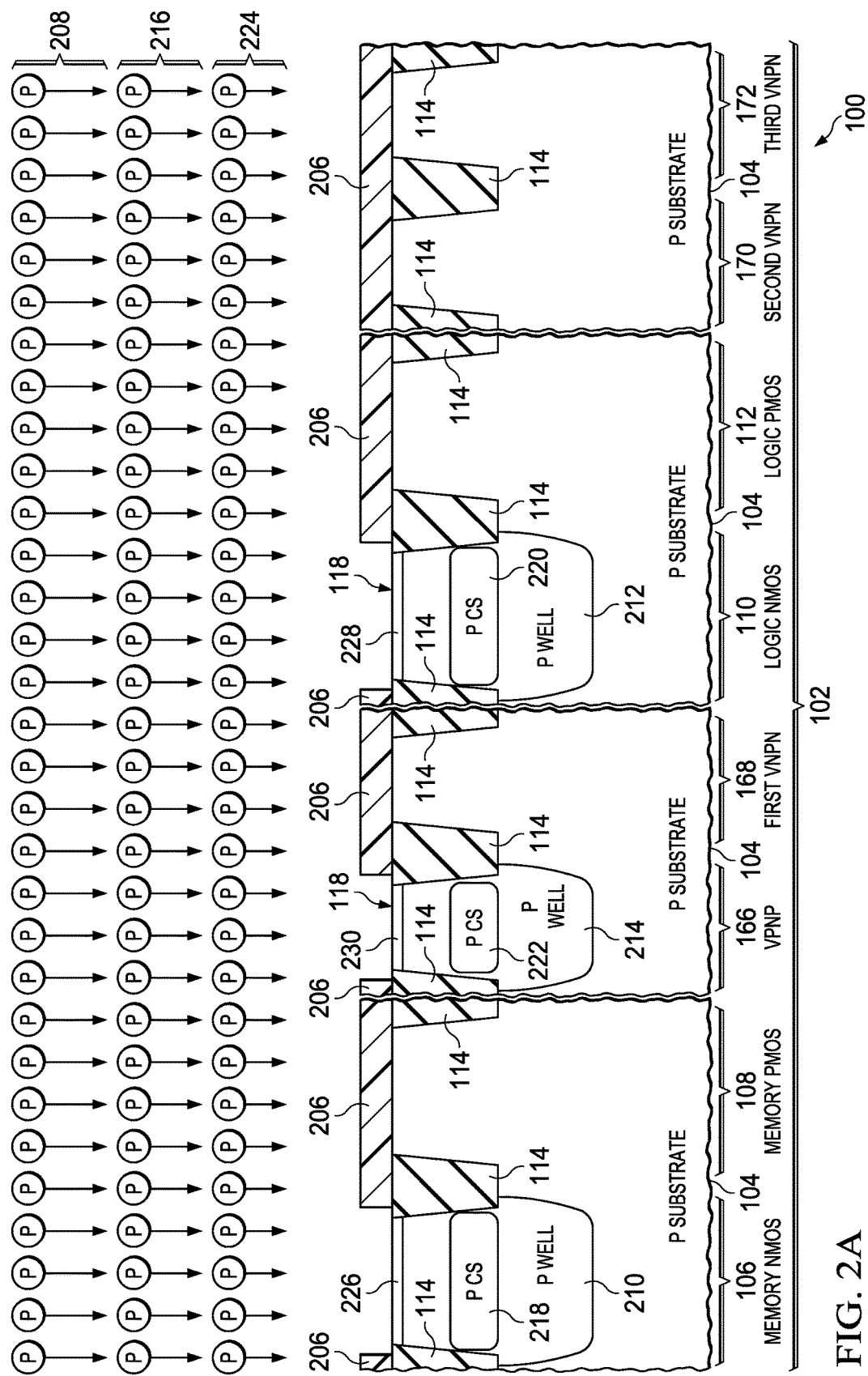
FIG. 2A through FIG. 2D are cross sections of the integrated circuit of FIG. 1, depicted in key steps of an example method of formation.

FIG. 2A through FIG. 2D are cross sections of the integrated circuit of FIG. 1, depicted in key steps of an example method of formation. Referring to FIG. 2A, the field oxide 114 is formed in the substrate 102 of the integrated circuit 100. The field oxide 114 may be formed by a shallow trench isolation (STI) process. An example STI process includes forming a CMP stop layer of silicon nitride over the substrate 102, etching isolation trenches through the CMP stop layer and into the substrate 102, and filling the isolation trenches with silicon dioxide using a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (APCVD) process using silane, or a subatmospheric chemical vapor deposition (SACVD) process using dichlorosilane. Excess silicon dioxide is removed from over the CMP stop layer by an oxide chemical mechanical polish (CMP) process, and the CMP stop layer is subsequently removed, leaving the field oxide 114. Alternatively, the field oxide 114 may be formed by a local oxidation of silicon (LOCOS) process. An example LOCOS process includes forming a silicon nitride mask layer over a layer of LOCOS pad oxide over the substrate 102. The silicon nitride mask layer is removed in areas for the field oxide 114, exposing the LOCOS pad oxide. Silicon dioxide is formed in the areas exposed by the silicon nitride mask layer by thermal oxidation, to form the field oxide 114. The silicon nitride mask layer is subsequently removed, leaving the field oxide 114 in place.

A layer of pad oxide, not shown, may be formed over a top surface of the substrate 102 to protect the substrate 102 during subsequent process steps. A global NMOS mask 206 is formed over the top surface of the substrate 102. The global NMOS mask 206 may include photoresist formed by a photolithographic process, and may include a layer of anti-reflection material such as a bottom anti-reflection coat (BARC). The global NMOS mask 206 exposes areas for the memory NMOS 106 and the logic NMOS 110, and covers areas for the memory PMOS 108 and the logic PMOS 112. In the instant example, the global NMOS mask 206 also exposes areas for the VPNP 166 and covers areas for the first VNPN 168, the second VNPN 170 and the third VNPN 172.

A well global dose of p-type dopants 208 such as boron is implanted into the substrate 102 in the areas exposed by the global NMOS mask 206 to form p-type well implanted regions, including a p-type well implanted region 210, labeled "P WELL," in the area for the memory NMOS 106, a p-type well implanted region 212, labeled "P WELL," in the area for the logic NMOS 110, and a p-type well implanted region 214, labeled "P WELL," in the area for the VPNP 166. The well global dose of p-type dopants 208 may have, for example, a dose of $1 \times 10^{13}$ cm$^{-2}$ to $5 \times 10^{13}$ cm$^{-2}$, and may be implanted at an energy of 150 kiloelectron-volts (keV) to 200 keV.

A channel stop global dose of p-type dopants 216 such as boron is implanted into the substrate 102 in the areas exposed by the global NMOS mask 206 to form p-type channel stop implanted regions, including a p-type channel stop implanted region 218, labeled "P CS," in the area for the memory NMOS 106, a p-type channel stop implanted region 220, labeled "P CS," in the area for the logic NMOS 110, and a p-type channel stop implanted region 222, labeled "P CS," in the area for the VPNP 166. The channel stop global dose of p-type dopants 216 may have, for example, a dose of $8 \times 10^{12}$ cm$^{-2}$ to $4 \times 10^{13}$ cm$^{-2}$, and may be implanted at an energy of 75 kiloelectron-volts (keV) to 125 keV.

A threshold adjust global dose of p-type dopants 224 such as boron, gallium and/or indium is implanted into the substrate 102 in the areas exposed by the global NMOS mask 206 to form p-type threshold adjust implanted regions, including a p-type threshold adjust implanted region 226 in the area for the memory NMOS 106, a p-type threshold adjust implanted region 228 in the area for the logic NMOS 110, and a p-type threshold adjust implanted region 230 in the area for the VPNP 166. The threshold adjust global dose of p-type dopants 224 may have, for example, a dose of $1 \times 10^{12}$ cm$^{-2}$ to $1 \times 10^{13}$ cm$^{-2}$, and may be implanted at a depth of 30 nanometers to 75 nanometers. For example, indium may be implanted with an energy of 50 keV to 150 keV to provide a depth of 30 nanometers to 75 nanometers.

The well global dose of p-type dopants 208, the channel stop global dose of p-type dopants 216 and the threshold adjust global dose of p-type dopants 224 may be implanted in any order. The global NMOS mask 206 is subsequently removed, for example by an ash process followed by a wet clean process. The substrate 102 may optionally be annealed after removing the global NMOS mask 206, before any subsequent implants, to activate the implanted dopants 208, 216 and 224. Alternatively, the substrate 102 may be annealed after subsequent implants.

Figure 2B:
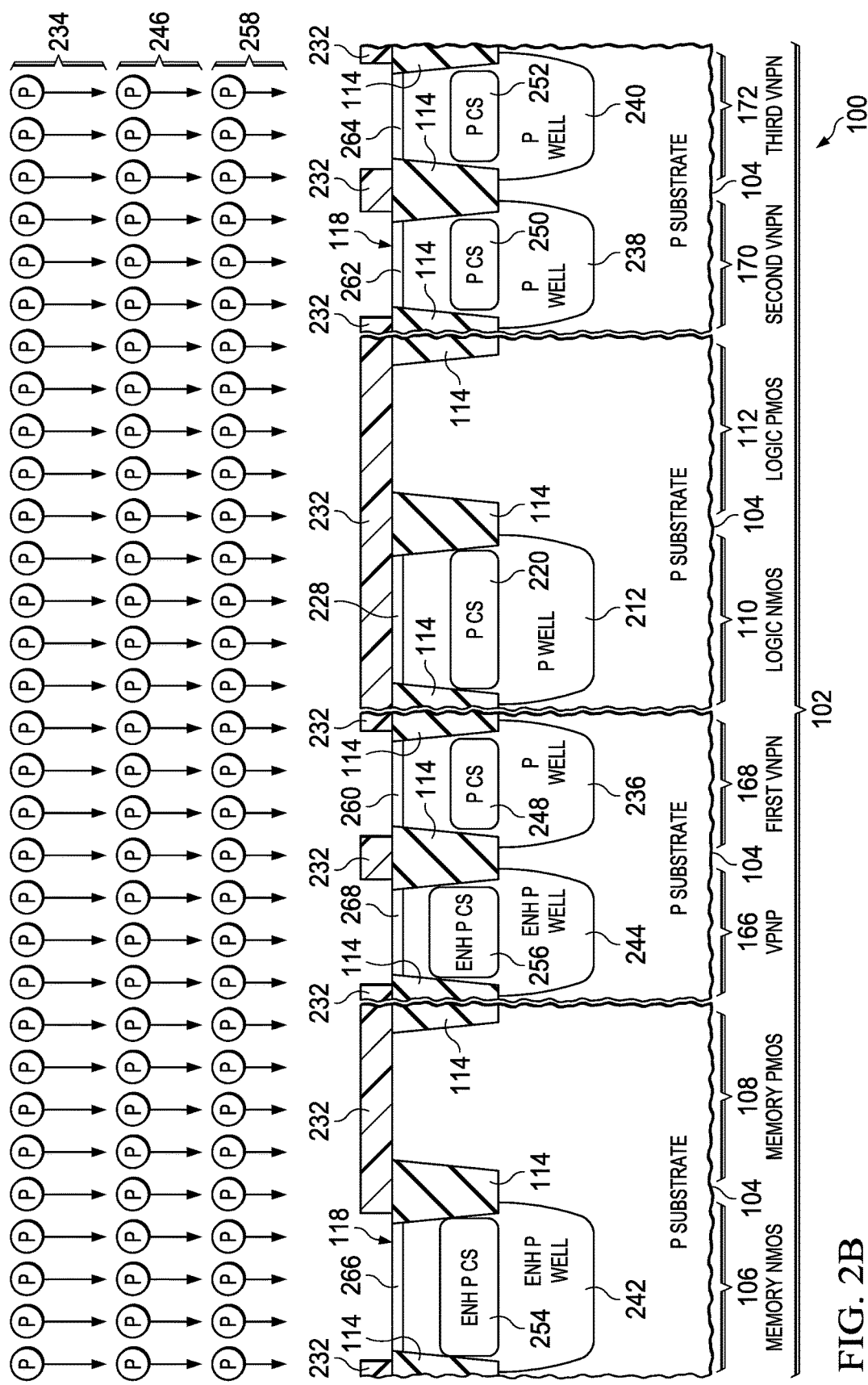

Referring to FIG. 2B, an adder NMOS mask 232 is formed over the top surface of the substrate 102. The adder NMOS mask 232 may be formed similarly to the global NMOS mask 206 of FIG. 2A. The adder NMOS mask 232 exposes areas for the memory NMOS 106, and covers areas for the logic NMOS 110, the memory PMOS 108 and the logic PMOS 112. In the instant example, the adder NMOS mask 232 also exposes areas for the VPNP 166, the first VNPN 168, the second VNPN 170 and the third VNPN 172.

A well adder dose of p-type dopants 234 such as boron is implanted into the substrate 102 in the areas exposed by the adder NMOS mask 232 to form p-type well implanted regions and p-type enhanced well implanted regions. The p-type well implanted regions are formed in areas which did not receive the well global dose of p-type dopants 208 of FIG. 2A. The p-type enhanced well implanted regions are formed in areas which did receive the well global dose of p-type dopants 208, so that a total dose of p-type dopants is increased in each of the p-type enhanced well implanted regions. The p-type well implanted regions include a p-type well implanted region 236, labeled "P WELL," in the area for the first VNPN 168, a p-type well implanted region 238, labeled "P WELL," in the area for the second VNPN 170, and a p-type well implanted region 240, labeled "P WELL," in the area for the third VNPN 172. The p-type enhanced well implanted regions include a p-type enhanced well implanted region 242, labeled "ENH P WELL," in the area for the memory NMOS 106 and a p-type enhanced well implanted region 244, labeled "ENH P WELL," in the area for the VPNP 166. The well adder dose of p-type dopants 234 may have, for example, a dose of 25 percent to 150 percent of the well global dose of p-type dopants 208, and may be implanted at an energy 20 keV to 70 keV less than the energy of the well global dose of p-type dopants 208.

A channel stop adder dose of p-type dopants 246 such as boron is implanted into the substrate 102 in the areas exposed by the adder NMOS mask 232 to form p-type channel stop implanted regions and p-type enhanced channel stop implanted regions. The p-type channel stop implanted regions are formed in areas which did not receive the channel stop global dose of p-type dopants 216 of FIG. 2A. The p-type enhanced channel stop implanted regions are formed in areas which did receive the channel stop global dose of p-type dopants 216, so that a total dose of p-type dopants is increased in each of the p-type enhanced channel stop implanted regions. The p-type channel stop implanted regions include a p-type channel stop implanted region 248, labeled "P CS," in the area for the first VNPN 168, a p-type channel stop implanted region 250, labeled "P CS," in the area for the second VNPN 170, and a p-type channel stop implanted region 252, labeled "P CS," in the area for the third VNPN 172. The p-type enhanced channel stop implanted regions include a p-type enhanced channel stop implanted region 254, labeled "ENH P CS," in the area for the memory NMOS 106 and a p-type enhanced channel stop implanted region 256, labeled "ENH P CS," in the area for the VPNP 166. The channel stop adder dose of p-type dopants 246 is 50 percent to 150 percent of the channel stop global dose of p-type dopants 216, and may be implanted at an energy 10 keV to 40 keV less than the energy of the channel stop global dose of p-type dopants 216.

A threshold adjust adder dose of p-type dopants 258 such as boron is implanted into the substrate 102 in the areas exposed by the adder NMOS mask 232 to form p-type threshold adjust implanted regions and p-type enhanced threshold adjust implanted regions. The p-type threshold adjust implanted regions are formed in areas which did not receive the threshold adjust global dose of p-type dopants 224 of FIG. 2A. The p-type enhanced threshold adjust implanted regions are formed in areas which did receive the threshold adjust global dose of p-type dopants 224, so that a total dose of p-type dopants is increased in each of the p-type enhanced threshold adjust implanted regions. The p-type threshold adjust implanted regions include a p-type threshold adjust implanted region 260 in the area for the first VNPN 168, a p-type threshold adjust implanted region 262 in the area for the second VNPN 170, and a p-type threshold adjust implanted region 264 in the area for the third VNPN 172. The p-type enhanced threshold adjust implanted regions include a p-type enhanced threshold adjust implanted region 266 in the area for the memory NMOS 106 and a p-type enhanced threshold adjust implanted region 268 in the area for the VPNP 166. The threshold adjust adder dose of p-type dopants 258 may be, for example, 25 percent to 75 percent of the threshold adjust global dose of p-type dopants 224, and may be implanted at a similar energy as the threshold adjust global dose of p-type dopants 224.

The well adder dose of p-type dopants 234, the channel stop adder dose of p-type dopants 246 and the threshold adjust adder dose of p-type dopants 258 may be implanted in any order. The adder NMOS mask 232 is subsequently removed, for example similarly to the global NMOS mask 206. The substrate 102 may optionally be annealed after removing the adder NMOS mask 232, before any subsequent implants, or may be annealed after subsequent implants.

Figure 2C:
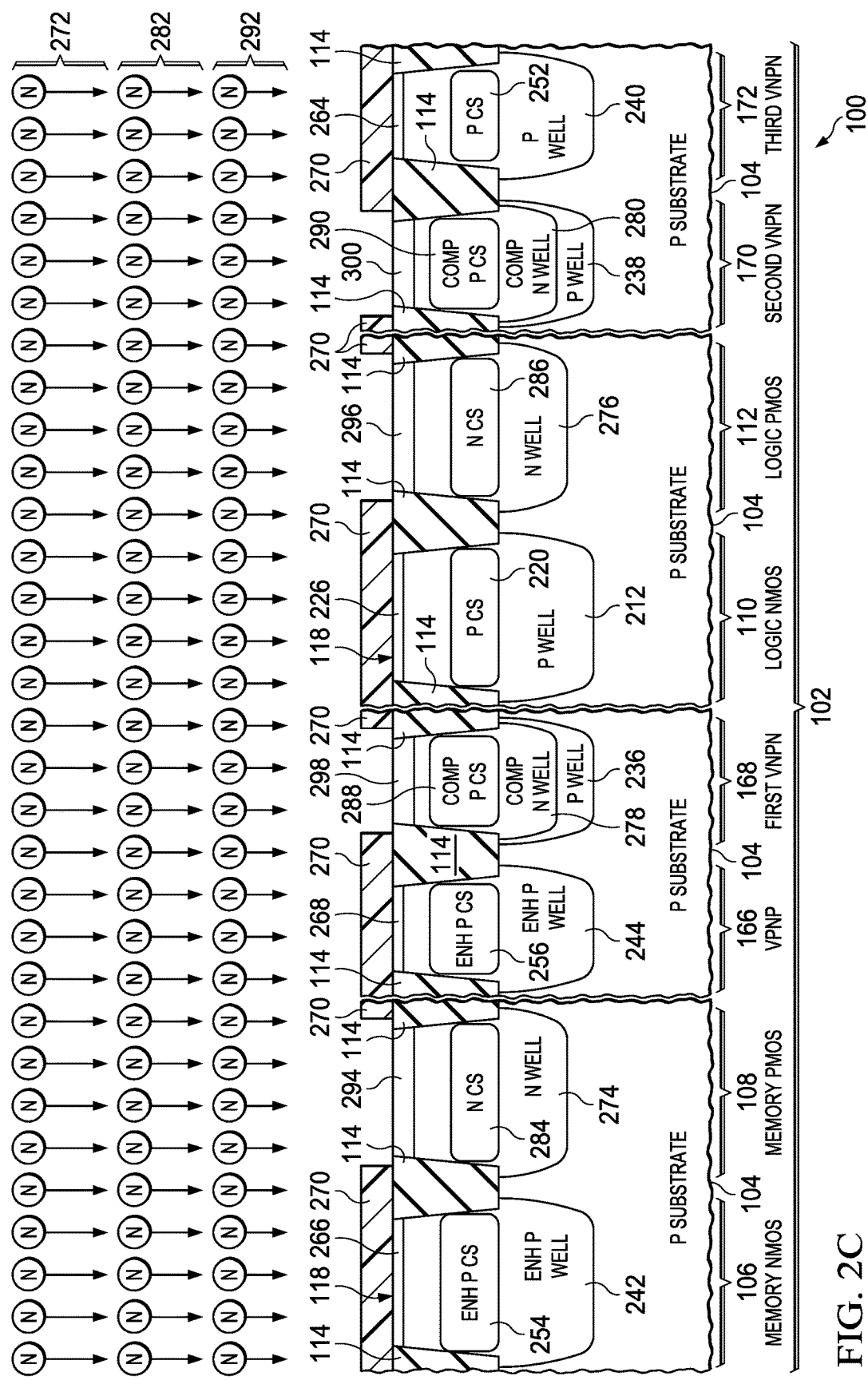

Referring to FIG. 2C, a global PMOS mask 270 is formed over the top surface of the substrate 102. The global PMOS mask 270 may be formed similarly to the global NMOS mask 206 of FIG. 2A. The global PMOS mask 270 exposes areas for the memory PMOS 108 and the logic PMOS 112, and covers areas for the memory NMOS 106 and the logic NMOS 110. In the instant example, the global PMOS mask 270 also exposes areas for the first VNPN 168 and the second VNPN 170, and covers areas for the VPNP 166 and the third VNPN 172.

A well global dose of n-type dopants 272 such as phosphorus is implanted into the substrate 102 in the areas exposed by the global PMOS mask 270 to form n-type well implanted regions and n-type compensated well implanted regions. The n-type well implanted regions are formed in areas which did not receive either the well global dose of p-type dopants 208 of FIG. 2A or the well adder dose of p-type dopants 234 of FIG. 2B. The n-type compensated well implanted regions are formed in areas which received either the well global dose of p-type dopants 208 or the well adder dose of p-type dopants 234. The n-type well implanted regions include an n-type well implanted region 274, labeled "N WELL," in the area for the memory PMOS 108, and an n-type well implanted region 276, labeled "N WELL," in the area for the logic PMOS 112. The n-type compensated well implanted regions include an n-type compensated well implanted region 278, labeled "COMP N WELL," in the area for the first VNPN 168 and an n-type compensated well implanted region 280, labeled "COMP N WELL," in the area for the second VNPN 170. The well global dose of n-type dopants 272 may have, for example, a dose of $2 \times 10^{13}$ $cm^{-2}$ to $1 \times 10^{14}$ $cm^{-2}$, and may be implanted at an energy of 300 keV to 400 keV.

A channel stop global dose of n-type dopants 282 such as phosphorus is implanted into the substrate 102 in the areas exposed by the global PMOS mask 270 to form n-type channel stop implanted regions and p-type compensated channel stop implanted regions. The n-type channel stop implanted regions are formed in areas which did not receive either the channel stop global dose of p-type dopants 216 of FIG. 2A or the channel stop adder dose of p-type dopants 246 of FIG. 2B. The p-type compensated channel stop implanted regions are formed in areas which received either the channel stop global dose of p-type dopants 216 or the channel stop adder dose of p-type dopants 246. The n-type channel stop implanted regions include an n-type channel stop implanted region 284, labeled "N CS," in the area for the memory PMOS 108, and an n-type channel stop implanted region 286, labeled "N CS," in the area for the logic PMOS 112. The p-type compensated channel stop implanted regions include a p-type compensated channel stop implanted region 288, labeled "COMP P CS," in the area for the first VNPN 168 and a p-type compensated channel stop implanted region 290, labeled "COMP P CS," in the area for the second VNPN 170. The channel stop global dose of n-type dopants 282 may have, for example, a dose of $3 \times 10^{12}$ $cm^{-2}$ to $3 \times 10^{13}$ $cm^{-2}$, and may be implanted at an energy of 200 keV to 275 keV.

A threshold adjust global dose of n-type dopants 292 such as phosphorus, arsenic and/or antimony is implanted into the substrate 102 in the areas exposed by the global PMOS mask 270 to form n-type threshold implanted regions and compensated threshold implanted regions. The n-type threshold implanted regions are formed in areas which did not receive either the threshold adjust global dose of p-type dopants 224 of FIG. 2A or the threshold adjust adder dose of p-type dopants 258 of FIG. 2B. The compensated threshold implanted regions are formed in areas which received either the threshold adjust global dose of p-type dopants 224 or the threshold adjust adder dose of p-type dopants 258, and may be n-type or p-type. The n-type threshold implanted regions include an n-type threshold implanted region 294 in the area for the memory PMOS 108 and an n-type threshold implanted region 296 in the area for the logic PMOS 112. The compensated threshold implanted regions include a compensated threshold implanted region 298 in the area for the first VNPN 168 and a compensated threshold implanted region 300 in the area for the second VNPN 170. The threshold adjust global dose of n-type dopants 292 may have, for example, a dose of $1 \times 10^{12}$ $cm^{-2}$ to $1 \times 10^{13}$ $cm^{-2}$, and may be implanted at a depth of 20 nanometers to 50 nanometers. For example, arsenic may be implanted at an energy of 20 keV to 70 keV to provide a depth of 20 nanometers to 50 nanometers.

The well global dose of n-type dopants 272, the channel stop global dose of n-type dopants 282 and the threshold adjust global dose of n-type dopants 292 may be implanted in any order. The global PMOS mask 270 is subsequently removed, for example similarly to the global NMOS mask 206 of FIG. 2A. The substrate 102 may optionally be annealed after removing the global PMOS mask 270, before any subsequent implants, or may be annealed after subsequent implants.

Figure 2D:
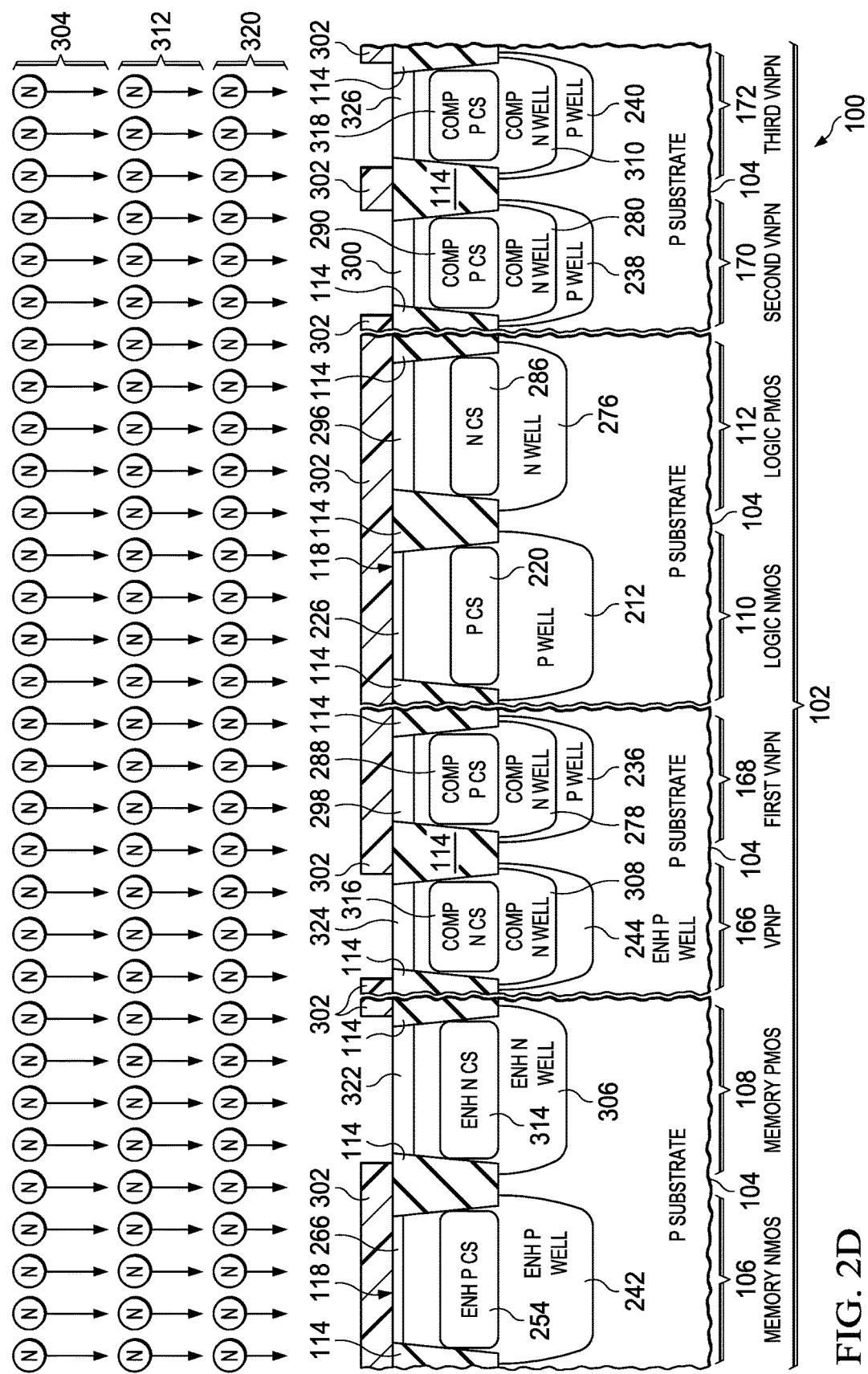

Referring to FIG. 2D, an adder PMOS mask 302 is formed over the top surface of the substrate 102. The adder PMOS mask 302 may be formed similarly to the global NMOS mask 206 of FIG. 2A. The adder PMOS mask 302 exposes areas for the memory PMOS 108, and covers areas for the logic NMOS 110, the memory NMOS 106 and the logic PMOS 112. In the instant example, the adder PMOS mask 302 also exposes areas for the VPNP 166, the second VNPN 170 and the third VNPN 172.

A well adder dose of n-type dopants 304 such as phosphorus is implanted into the substrate 102 in the areas exposed by the adder PMOS mask 302 to form n-type enhanced well implanted regions and n-type compensated well implanted regions. The n-type enhanced well implanted regions are formed in areas which received the well global dose of n-type dopants 272 of FIG. 2C, and did not receive the well global dose of p-type dopants 208 of FIG. 2A or the well adder dose of p-type dopants 234 of FIG. 2B, so that a total dose of n-type dopants is increased in each of the n-type enhanced well implanted regions. The n-type compensated well implanted regions are formed in areas which received either the well global dose of p-type dopants 208 of FIG. 2A or the well adder dose of p-type dopants 234 of FIG. 2B. The n-type enhanced well implanted regions include an n-type enhanced well implanted region 306, labeled "ENH N WELL," in the area for the memory PMOS 108. The n-type compensated well implanted regions include an n-type compensated well implanted region 308, labeled "COMP N WELL," in the area for the VPNP 166, and an n-type compensated well implanted region 310, labeled "COMP N WELL," in the area for the third VNPN 172. The n-type compensated well implanted region 280, labeled "COMP N WELL," in the area for the second VNPN 170 also receives the well adder dose of n-type dopants 304 and so remains an n-type compensated well implanted region. The well adder dose of n-type dopants 304 may have, for example, a dose of 25 percent to 150 percent of the well global dose of n-type dopants 272, and may be implanted at an energy 40 keV to 70 keV less than the energy of the well global dose of n-type dopants 272.

A channel stop adder dose of n-type dopants 312 such as phosphorus is implanted into the substrate 102 in the areas exposed by the adder PMOS mask 302 to form n-type enhanced channel stop implanted regions, n-type compensated channel stop implanted regions and p-type compensated channel stop implanted regions. The n-type enhanced channel stop implanted regions are formed in areas which received the channel stop global dose of n-type dopants 282 of FIG. 2C, and did not receive either the channel stop global dose of p-type dopants 216 of FIG. 2A or the channel stop adder dose of p-type dopants 246 of FIG. 2B, so that a total dose of n-type dopants is increased in each of the n-type enhanced channel stop implanted regions. The n-type compensated channel stop implanted regions are formed in areas which received either the channel stop global dose of p-type dopants 216 of FIG. 2A or the channel stop adder dose of p-type dopants 246 of FIG. 2B, and convert to n-type. The p-type compensated channel stop implanted regions are formed in areas which received either the channel stop global dose of p-type dopants 216 of FIG. 2A or the channel stop adder dose of p-type dopants 246 of FIG. 2B, and remain p-type. The n-type enhanced channel stop implanted regions include an n-type enhanced channel stop implanted region 314, labeled "ENH N CS," in the area for the memory PMOS 108. The n-type compensated channel stop implanted regions include an n-type compensated channel stop implanted region 316, labeled "COMP N CS," in the area for the VPNP 166. The p-type compensated channel stop implanted regions include a p-type compensated channel stop implanted region 318, labeled "COMP P CS," in the area for the third VNPN 172. The p-type compensated channel stop implanted region 290, labeled "COMP P CS," in the area for the second VNPN 170 also receives the channel stop adder dose of n-type dopants 312 and remains a p-type compensated channel stop implanted region. The channel stop adder dose of n-type dopants 312 is 50 percent to 150 percent of the channel stop global dose of n-type dopants 282, and may be implanted at an energy 25 keV to 50 keV less than the energy of the channel stop global dose of n-type dopants 282.

A threshold adjust adder dose of n-type dopants 320 such as phosphorus, arsenic and/or antimony is implanted into the substrate 102 in the areas exposed by the adder PMOS mask 302 to form n-type enhanced threshold adjust implanted regions and compensated threshold adjust implanted regions. The n-type enhanced threshold adjust implanted regions are formed in areas which received the threshold adjust global dose of n-type dopants 292 of FIG. 2C and did not receive either the threshold adjust global dose of p-type dopants 224 of FIG. 2A or the threshold adjust adder dose of p-type dopants 258 of FIG. 2B, so that a total dose of n-type dopants is increased in each of the n-type enhanced threshold adjust implanted regions. The compensated threshold adjust implanted regions are formed in areas which received either the threshold adjust global dose of p-type dopants 224 of FIG. 2A or the threshold adjust adder dose of p-type dopants 258 of FIG. 2B, and may be n-type or p-type. The n-type enhanced threshold adjust implanted regions include an n-type enhanced threshold adjust implanted region 322 in the area for the memory PMOS 108. The compensated threshold adjust implanted regions include a compensated threshold adjust implanted region 324 in the area for the VPNP 166, and a compensated threshold adjust implanted region 326 in the area for the third VNPN 172. The compensated threshold adjust implanted region 300 in the area for the second VNPN 170 also receives the threshold adjust adder dose of n-type dopants 320 and remains a compensated threshold adjust implanted region. The threshold adjust adder dose of n-type dopants 320 may be, for example, 25 percent to 75 percent of the threshold adjust global dose of n-type dopants 292, and may be implanted at a similar energy as the threshold adjust global dose of n-type dopants 292.

The well adder dose of n-type dopants 304, the channel stop adder dose of n-type dopants 312 and the threshold adjust adder dose of n-type dopants 320 may be implanted in any order. The adder PMOS mask 302 is subsequently removed, for example similarly to the global NMOS mask 206 of FIG. 2A. The substrate 102 may optionally be annealed after removing the adder PMOS mask 302. The global NMOS mask 206, the adder NMOS mask 232, the global PMOS mask 270 and the adder PMOS mask 302 may be formed in any order to produce the structure of FIG. 1.

Figure 3:
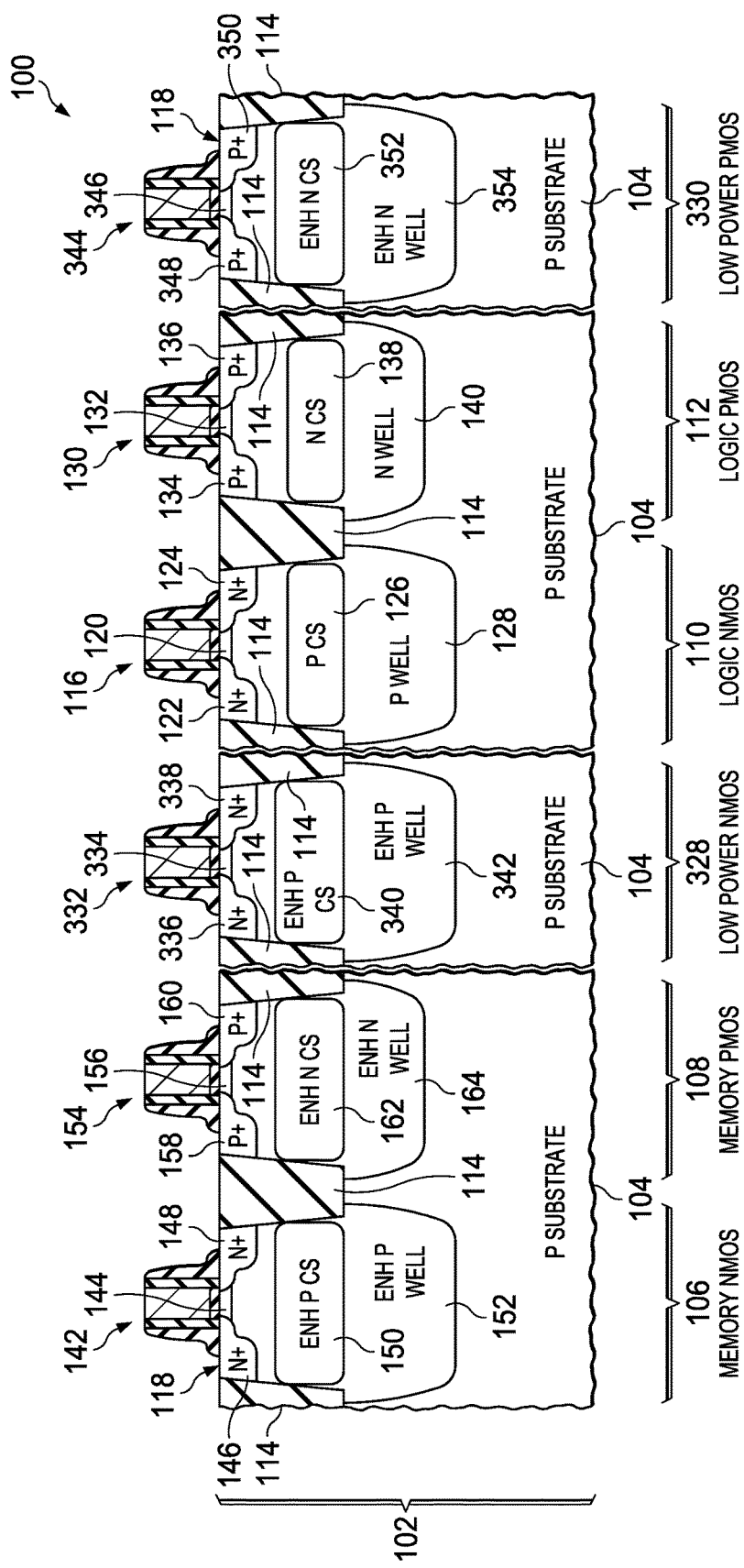
FIG. 3 is a cross section of an alternate version of the integrated circuit of FIG. 1.

FIG. 3 is a cross section of an alternate version of the integrated circuit of FIG. 1. In the instant version, the integrated circuit 100 includes a low power NMOS transistor 328, referred to herein as the low power NMOS 328, and a low power PMOS transistor 330, referred to herein as the low power PMOS 330, in addition to the memory NMOS 106, the memory PMOS 108, the logic NMOS 110, and the logic PMOS 112 described in reference to FIG. 1. The low power NMOS 328, and the low power PMOS 330 may be part of a low power logic circuit of the integrated circuit 100. The low power NMOS 328 is formed concurrently with the memory NMOS 106, and the low power PMOS 330 is formed concurrently with the memory PMOS 108, as described in reference to FIG. 2A through FIG. 2D. The low power NMOS 328 and the low power PMOS 330 may provide the same advantages to the low power logic circuit that the memory NMOS 106 and the memory PMOS 108 provide to the memory cell.

The low power NMOS 328 includes a gate structure 332 on the top surface 118 of the substrate 102. A p-type low power threshold layer 334 may be disposed in the substrate 102 extending to the top surface 118 immediately below the gate structure 332. An average dopant density of the low power threshold layer 344 is equal to the average dopant density of the memory threshold layer 144 of the memory NMOS 106. An n-type source 336 and n-type drain 338 are disposed in the substrate 102 adjacent to the low power threshold layer 334 and extending partway under the gate structure 332. A p-type low power channel stop layer 340, labeled "ENH P CS" in FIG. 3, is disposed in the substrate 102 under the source 336, drain 338 and memory threshold layer 334. An average dopant density of p-type dopants in the low power channel stop layer 340 is equal to the average dopant density of the memory channel stop layer 150 of the memory NMOS 106. The low power threshold layer 334, the source 336, the drain 338 and the low power channel stop layer 340 may be disposed in a p-type enhanced well 342, labeled "ENH P WELL" in FIG. 3, which extends below the field oxide 114. An average dopant density of a portion of the p-type enhanced well 342 below the field oxide 114 is equal to the average dopant density of the portion of the p-type enhanced well 152 of the memory NMOS 106 below the field oxide 114.

The low power PMOS 330 includes a gate structure 344 on the top surface 118 of the substrate 102. An n-type low power threshold layer 346 may be disposed in the substrate 102 extending to the top surface 118 immediately below the gate structure 344. An average dopant density of the low power threshold layer 346 is equal to the average dopant density of the memory threshold layer 156 of the memory PMOS 108. A p-type source 348 and p-type drain 350 are disposed in the substrate 102 adjacent to the low power threshold layer 346 and extending partway under the gate structure 344. An n-type low power channel stop layer 352, labeled "ENH N CS" in FIG. 3, is disposed in the substrate 102 under the source 348, drain 350 and low power threshold layer 346. An average dopant density of n-type dopants in the low power channel stop layer 352 is equal to the average dopant density of the memory channel stop layer 162 of the memory PMOS 108. The low power threshold layer 346, the source 348, the drain 350 and the low power channel stop layer 352 may be disposed in an n-type enhanced well 354, labeled "ENH N WELL" in FIG. 3, which extends below the field oxide 114. An average dopant density of a portion of the n-type enhanced well 354 below the field oxide 114 is equal to the average dopant density of the portion of the n-type enhanced well 154 of the memory PMOS 108 below the field oxide 114.

The integrated circuit 100 may include any combination of the VPNP 166, the first VNPN 168, the second VNPN 170, and the third VNPN 172, and possibly other such vertical bipolar transistors, as described in reference to FIG. 1, and the low power NMOS 328 and the low power PMOS 330 of the instant example. Forming the elements of these components using the global masks and adder masks as described in reference to FIG. 2A through FIG. 2D may advantageously reduce fabrication costs of the integrated circuit 100.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate comprising a semiconductor material;
   a logic n-channel metal oxide semiconductor (NMOS) transistor, comprising a p-type logic channel stop layer disposed in a first p-type well in the substrate;
   a memory NMOS transistor, comprising a p-type memory channel stop layer disposed in a second p-type well in the substrate, wherein an average dopant density of the p-type memory channel stop layer is 50 percent to 150 percent higher than an average dopant density of the p-type logic channel stop layer;
   a logic p-channel metal oxide semiconductor (PMOS) transistor, comprising an n-type logic channel stop layer disposed in a first n-type well in the substrate; and
   a memory PMOS transistor, comprising an n-type memory channel stop layer disposed in a second n-type well in the substrate, wherein an average dopant density of the n-type memory channel stop layer is 50 percent to 150 percent higher than an average dopant density of the n-type logic channel stop layer.

2. The integrated circuit of claim 1, further comprising a vertical PNP bipolar transistor, wherein a base of the vertical PNP bipolar transistor comprises:
   p-type dopants having an average dopant density equal to an average dopant density of the p-type memory channel stop layer; and
   n-type dopants having an average dopant density equal to a difference between an average dopant density of the n-type memory channel stop layer and an average dopant density of the n-type logic channel stop layer.

3. The integrated circuit of claim 1, further comprising a vertical NPN bipolar transistor, wherein a base of the vertical NPN bipolar transistor comprises:
   n-type dopants having an average dopant density equal to an average dopant density of the n-type memory channel stop layer; and
   p-type dopants having an average dopant density equal to a difference between an average dopant density of the p-type memory channel stop layer and an average dopant density of the p-type logic channel stop layer.

4. The integrated circuit of claim 1, further comprising a vertical NPN bipolar transistor, wherein a base of the vertical NPN bipolar transistor comprises:

n-type dopants having an average dopant density equal to an average dopant density of the n-type logic channel stop layer; and p-type dopants having an average dopant density equal to a difference between an average dopant density of the p-type memory channel stop layer and an average dopant density of the p-type logic channel stop layer.

5. The integrated circuit of claim 1, further comprising a vertical NPN bipolar transistor, wherein a base of the vertical NPN bipolar transistor comprises:

n-type dopants having an average dopant density equal to a difference between an average dopant density of the n-type memory channel stop layer and an average dopant density of the n-type logic channel stop layer; and p-type dopants having an average dopant density equal to a difference between an average dopant density of the p-type memory channel stop layer and an average dopant density of the p-type logic channel stop layer.

6. A method of forming an integrated circuit, comprising:
providing a substrate comprising a semiconductor material;
forming a first global mask over a top surface of the substrate which exposes an area for a first logic MOS transistor of a first polarity and an area for a first memory MOS transistor of the first polarity;
implanting a first channel stop global dose of dopants of a first conductivity type into a first well of the first conductivity type in the substrate in the area for the first logic MOS transistor and into a second well of the first conductivity type in the substrate in the area for the first memory MOS transistor while the first global mask is in place;
subsequently removing the first global mask;
forming a first adder mask over a top surface of the substrate which exposes the area for the first memory MOS transistor and covers the area for the first logic MOS transistor;
implanting a first channel stop adder dose of dopants of the first conductivity type into the second well in the substrate in the area for the first memory MOS transistor while the first adder mask is in place; and
subsequently removing the first adder mask.

7. The method of claim 6, wherein the first channel stop adder dose is 50 percent to 150 percent of the first channel stop global dose.

8. The method of claim 6, further comprising:
implanting a threshold adjust global dose of dopants of the first conductivity type into the substrate in the areas for the first logic MOS transistor and the first memory MOS transistor while the first global mask is in place; and
implanting a threshold adjust adder dose of dopants of the first conductivity type into the substrate in the area for the first memory MOS transistor while the first adder mask is in place.

9. The method of claim 6, further comprising:
implanting a well global dose of dopants of the first conductivity type into the substrate in the areas for the first logic MOS transistor and the first memory MOS transistor while the first global mask is in place; and
implanting a well adder dose of dopants of the first conductivity type into the substrate in the area for the first memory MOS transistor while the first adder mask is in place.

10. The method of claim 6, further comprising:
forming a second global mask over a top surface of the substrate which exposes an area for a second logic MOS transistor of a second, opposite, polarity and an area for a second memory MOS transistor of the second polarity;
implanting a second channel stop global dose of dopants of a second conductivity type into the substrate in the areas for the second logic MOS transistor and the second memory MOS transistor while the second global mask is in place;
subsequently removing the second global mask;
forming a second adder mask over a top surface of the substrate which exposes the area for the second memory MOS transistor and covers the area for the second memory MOS transistor;
implanting a second channel stop adder dose of dopants of the second conductivity type into the substrate in the area for the first memory MOS transistor while the second adder mask is in place; and
subsequently removing the second adder mask.

11. The method of claim 10, wherein:
the first global mask exposes an area for a vertical bipolar transistor;
the first adder mask exposes the area for the vertical bipolar transistor;
the second global mask covers the area for the vertical bipolar transistor;
the second adder mask exposes the area for the vertical bipolar transistor; and
the dopants of the first conductivity type of the first channel stop global dose, the dopants of the first conductivity type of the first channel stop adder dose, and the dopants of the second conductivity type of the second channel stop adder dose provide dopants for a base of the vertical bipolar transistor.

12. The method of claim 10, wherein:
the first global mask exposes an area for a vertical bipolar transistor;
the first adder mask covers the area for the vertical bipolar transistor;
the second global mask covers the area for the vertical bipolar transistor;
the second adder mask exposes the area for the vertical bipolar transistor; and
the dopants of the first conductivity type of the first channel stop global dose, and the dopants of the second conductivity type of the second channel stop adder dose provide dopants for a base of the vertical bipolar transistor.

13. The method of claim 10, wherein:
the first global mask covers an area for a vertical bipolar transistor;
the first adder mask exposes the area for the vertical bipolar transistor;
the second global mask covers the area for the vertical bipolar transistor;
the second adder mask exposes the area for the vertical bipolar transistor; and
the dopants of the first conductivity type of the first channel stop adder dose, and the dopants of the second conductivity type of the second channel stop adder dose provide dopants for a base of the vertical bipolar transistor.

* * * * *